United States Patent
Rascuna' et al.

(10) Patent No.: US 12,224,358 B2
(45) Date of Patent: Feb. 11, 2025

(54) JBS DEVICE WITH IMPROVED ELECTRICAL PERFORMANCES, AND MANUFACTURING PROCESS OF THE JBS DEVICE

(71) Applicant: STMicroelectronics S.r.l., Agrate Brianza (IT)

(72) Inventors: Simone Rascuna', Catania (IT); Gabriele Bellocchi, Catania (IT); Marco Santoro, Messina (IT)

(73) Assignee: STMicroelectronics S.R.L., Agrate Brianza (IT)

(*) Notice: Subject to any disclaimer, the term of this patent is extended or adjusted under 35 U.S.C. 154(b) by 455 days.

(21) Appl. No.: 17/584,185

(22) Filed: Jan. 25, 2022

(65) Prior Publication Data

US 2022/0246770 A1    Aug. 4, 2022

(30) Foreign Application Priority Data

Feb. 3, 2021    (IT) .......................... 102021000002333

(51) Int. Cl.
*H01L 29/872*    (2006.01)
*H01L 21/04*    (2006.01)
(Continued)

(52) U.S. Cl.
CPC .......... *H01L 29/872* (2013.01); *H01L 21/046* (2013.01); *H01L 29/1608* (2013.01); *H01L 29/6606* (2013.01)

(58) Field of Classification Search
None
See application file for complete search history.

(56) References Cited

U.S. PATENT DOCUMENTS

| | | | |
|---|---|---|---|
| 7,327,541 B1* | 2/2008 | Wang ...................... | H01L 29/87 257/355 |
| 2006/0220166 A1* | 10/2006 | Kikuchi ................ | H01L 29/872 257/481 |

(Continued)

FOREIGN PATENT DOCUMENTS

| | | |
|---|---|---|
| JP | 10233515 A | 9/1998 |
| JP | 2002314099 A | 10/2002 |
| JP | 2002359378 A | 12/2002 |

OTHER PUBLICATIONS

Draghici et al., "A new SiC diode with significantly reduced threshold voltage," Proceedings of the 29th International Symposium on Power Semiconductor Devices & ICs (ISPSD), May 28-Jun. 1, 2017, pp. 355-358.

*Primary Examiner* — Asok K Sarkar
(74) *Attorney, Agent, or Firm* — Seed IP Law Group LLP

(57) ABSTRACT

A Junction Barrier Schottky device includes a semiconductor body of SiC having a first conductivity. An implanted region having a second conductivity, extends into the semiconductor body from a top surface of the semiconductor body to form a junction barrier diode with the semiconductor body. An electrical terminal is in ohmic contact with the implanted region and in direct electrical contact with the top surface, laterally to the implanted region, to form a Schottky diode with the semiconductor body. The implanted region is formed by a first and a second portion electrically connected directly to each other and aligned along an alignment axis transverse to the top surface. Orthogonally to the alignment axis, the first portion has a first maximum width and the second portion has a second maximum width greater than the first maximum width.

20 Claims, 7 Drawing Sheets

(51) Int. Cl.
*H01L 29/16* (2006.01)
*H01L 29/66* (2006.01)

(56) References Cited

U.S. PATENT DOCUMENTS

| | | | |
|---|---|---|---|
| 2008/0121993 A1* | 5/2008 | Hefner | H01L 21/0465 |
| | | | 257/E29.256 |
| 2008/0173894 A1* | 7/2008 | Inoue | H01L 29/87 |
| | | | 257/E29.337 |
| 2009/0090920 A1* | 4/2009 | Endo | H01L 29/7813 |
| | | | 257/77 |
| 2015/0263180 A1 | 9/2015 | Hirakata | |

* cited by examiner

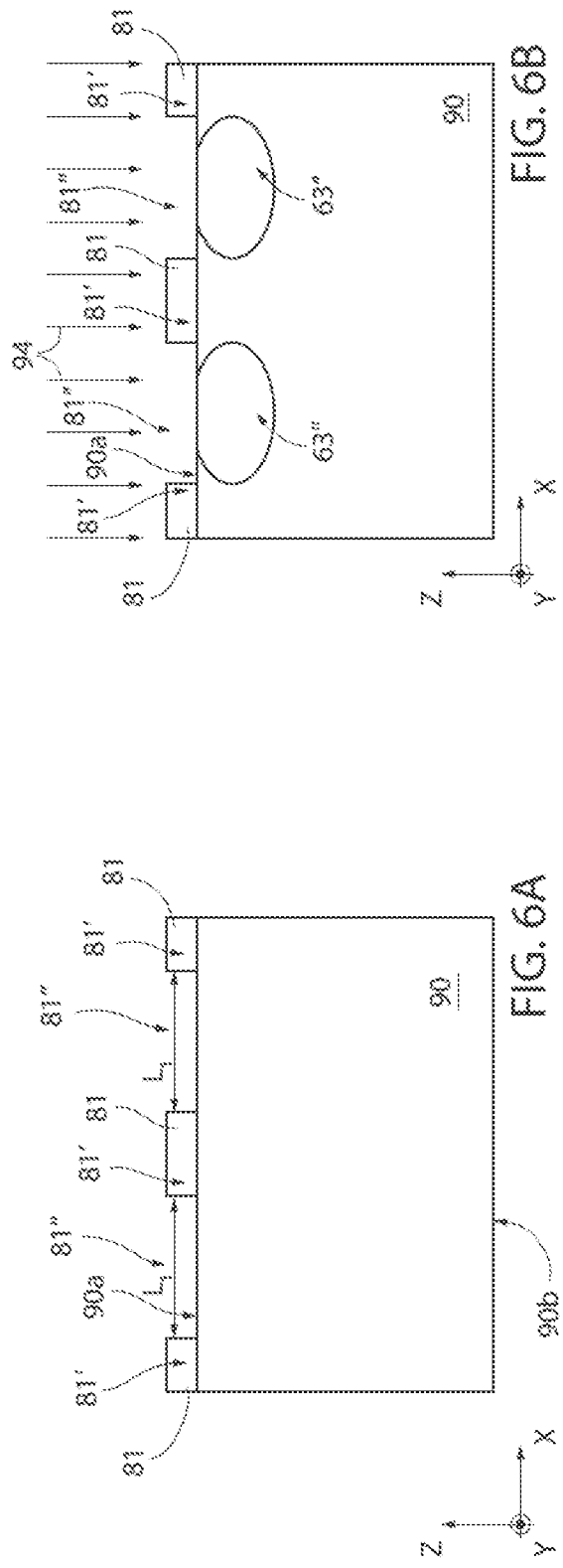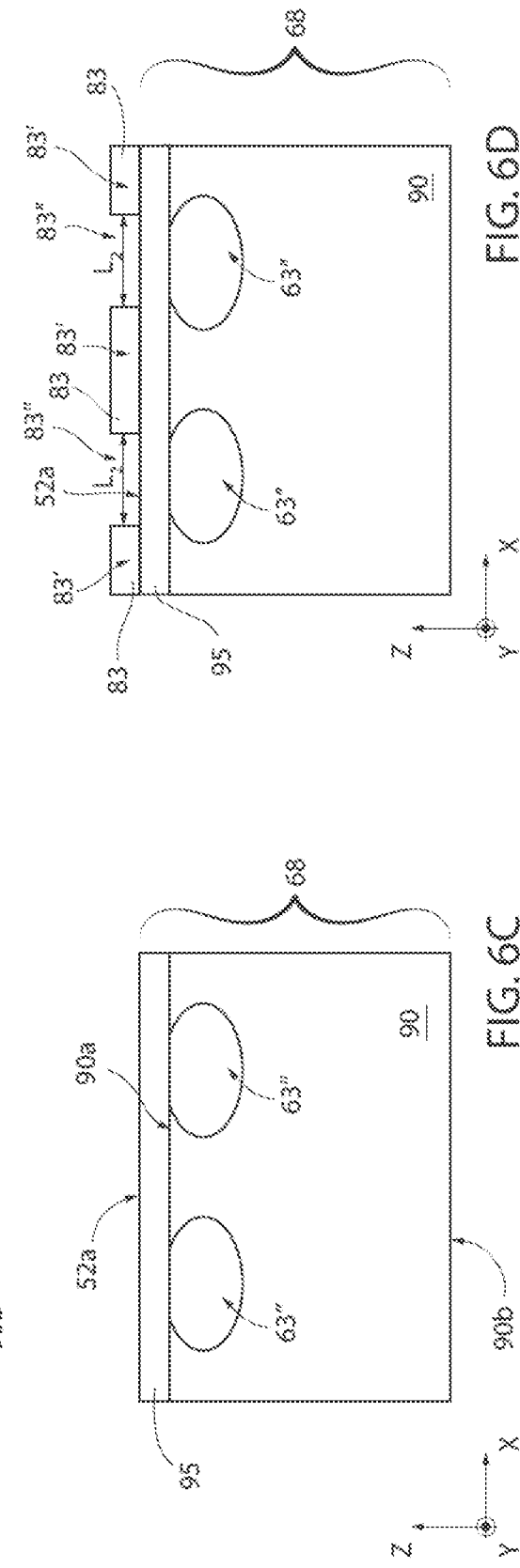

JBS DEVICE WITH IMPROVED ELECTRICAL PERFORMANCES, AND MANUFACTURING PROCESS OF THE JBS DEVICE

BACKGROUND

Technical Field

The present disclosure relates to a Junction Barrier Schottky, JBS, device with improved electrical performances, and manufacturing process of the JBS device.

Description of the Related Art

As it is known, semiconductor materials which have a wide band gap (e.g., which have an energy value $E_g$ of the band gap greater than 1.1 eV), low on-state resistance ($R_{ON}$), a high value of thermal conductivity, high operating frequency and high saturation velocity of charge carriers, are ideal for producing electronic components, such as diodes or transistors, in particular for power applications. A material having said characteristics, and designed to be used for manufacturing electronic components, is silicon carbide (SiC). In particular, silicon carbide, in its different polytypes (for example, 3C—SiC, 4H—SiC, 6H—SiC), is preferable to silicon as regards the properties listed previously.

Electronic devices provided on a silicon-carbide substrate, as compared to similar devices provided on a silicon substrate, have numerous advantages, such as low output resistance in conduction, low leakage current, high operating temperature, and high working frequencies.

In particular, SiC Schottky diodes have demonstrated higher switching performances, making them especially favorable for high frequency applications.

These Schottky diodes (hereinafter also referred to as "Schottky Barrier Diodes", SBDs) have, however, some limitations when are used in reverse bias (or reverse conduction state), due to high leakage currents (for example of a few tens or hundreds of µA). Furthermore, when SBDs are used in reverse bias, the well-known phenomenon of Schottky Barrier Height (SBH) lowering causes a rapid increase in the leakage current as the bias voltage increases, and this may lead to the well-known "soft-breakdown" phenomenon. This is especially undesirable when the SBDs operate at high temperatures, for example higher than 150° C., since this increase in the leakage current causes a further increase in the temperature of the SBDs, which may lead to the damage of the same.

To overcome both of these limitations, the most common solution is the use of a SiC-based Junction Barrier Schottky (JBS) diode. In particular, the JBS diode (hereinafter also referred to as JBS device) has at least one Schottky diode and at least one PN diode (i.e., semiconductor junction) arranged in parallel with each other.

BRIEF SUMMARY

The present disclosure provides a JBS device, an apparatus comprising the JBS device and a manufacturing process of the JBS device that at least partially overcome the drawbacks of the prior art.

According to the present disclosure, a JBS device, an apparatus comprising the JBS device and a manufacturing process of the JBS device are provided.

In at least one embodiment, a Junction Barrier Schottky (JBS) device is provided that includes a semiconductor body of silicon carbide having a first type of electrical conductivity. A first implanted region having a second type of electrical conductivity opposite to the first type of electrical conductivity extends into the semiconductor body from a top surface of the semiconductor body. The first implanted region forms a first junction barrier (JB) diode with the semiconductor body. A first electrical terminal is in ohmic contact with the first implanted region and in direct electrical contact with the top surface of the semiconductor body, laterally to the first implanted region. The first electrical terminal forms a Schottky diode with the semiconductor body. The first implanted region includes a first portion and a second portion electrically connected directly to each other and aligned with each other along a first alignment axis transverse to the top surface of the semiconductor body. The first portion of the first implanted region extends, along the first alignment axis, between the second portion of the first implanted region and the first electrical terminal. The first portion of the first implanted region has, orthogonally to the first alignment axis, a maximum width having a first value. The second portion of the first implanted region has, orthogonally to the first alignment axis, a respective maximum width having a second value greater than the first value.

In at least one embodiment, an apparatus is provided that includes at least one such Junction Barrier Schottky device.

In at least one embodiment, a manufacturing process of a Junction Barrier Schottky (JBS) device is provided that includes: forming, in a semiconductor body of silicon carbide having a first type of electrical conductivity, a first implanted region having a second type of electrical conductivity opposite to the first type of electrical conductivity and extending into the semiconductor body from a top surface of the semiconductor body, the first implanted region forming a first junction barrier (JB) diode with the semiconductor body; and forming a first electrical terminal in ohmic contact with the first implanted region and in direct electrical contact with the top surface of the semiconductor body, laterally to the first implanted region, the first electrical terminal forming a Schottky diode with the semiconductor body. The forming the first implanted region includes forming in the semiconductor body a first portion and a second portion of the first implanted region, electrically connected directly to each other and aligned with each other along a first alignment axis transverse to the top surface of the semiconductor body, the first portion of the first implanted region extending, along the first alignment axis, between the second portion of the first implanted region and the first electrical terminal. The first portion of the first implanted region has, orthogonally to the first alignment axis, a maximum width having a first value. The second portion of the first implanted region has, orthogonally to the first alignment axis, a respective maximum width having a second value greater than the first value.

BRIEF DESCRIPTION OF THE SEVERAL VIEWS OF THE DRAWINGS

For a better understanding of the present disclosure, a preferred embodiment is now described, purely by way of non-limiting example, with reference to the accompanying drawings, wherein:

FIGS. 6A-6E show, in cross-section view, respective manufacturing steps of the JBS device of FIG. 2, according to a further embodiment of manufacturing process.

DETAILED DESCRIPTION

Elements common to the different embodiments of the present disclosure, described hereinafter, are indicated with the same reference numbers.

Figure 1:
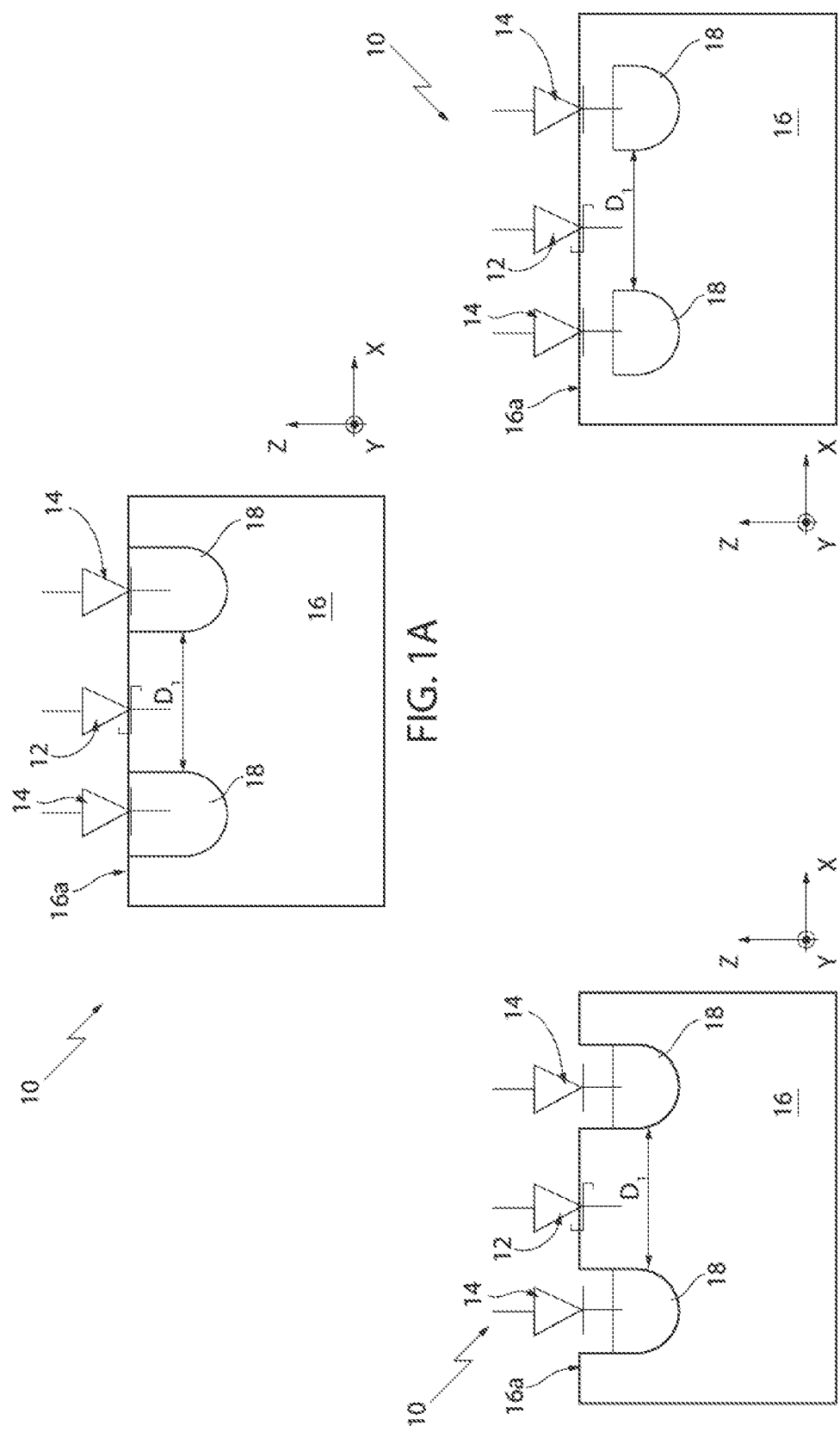
FIGS. 1A-1C show, in cross-section view, a JBS device according to respective embodiments of comparative examples.

FIGS. 1A-1C show respective JBS devices 10, according to respective comparative example embodiments. In detail, the parallel between the Schottky diodes 12 and the PN diodes 14 is carried out by forming, in a semiconductor body 16 of SiC and having a first type of electrical conductivity (of N-type), implanted regions 18 having a second type of electrical conductivity opposite to the first type of electrical conductivity (i.e., the implanted regions 18 are of P-type). The implanted regions 18 may extend into the semiconductor body 16: from a top surface 16a of the semiconductor body 16, as shown in FIG. 1A; in respective trenches formed in the semiconductor body 16 from the top surface 16a, in such a way that the implanted regions 18 extend deep into the semiconductor body 16 (i.e., not at the level of the top surface 16a), as shown in FIG. 1B; or in a floating manner, i.e., extending internally to the semiconductor body 16 so as to be completely surrounded by the latter, as shown in FIG. 1C. Furthermore, the JBS devices 10 comprise an anode metallization (not shown) extending on the top surface 16a. The implanted regions 18 and the semiconductor body 16 form the PN diodes 14, while the regions wherein the anode metallization and the semiconductor body 16 are in direct physical and electrical contact with each other form the Schottky diodes 12.

When the JBS device 10 operates in forward bias (or forward conduction state), the Schottky diodes 12 are in conduction. On the other hand, when the JBS device 10 operates in reverse bias, the conduction through the Schottky diodes 12 is inhibited by the "pinch-off" effect of the PN diodes 14, and the behavior of the JBS device 10 is similar to that of a PN junction.

As a result, the solutions shown in FIGS. 1B and 1C are preferable to that of FIG. 1A, since in the former the pinch-off effect occurs at a greater distance from the top surface 16a with respect to the case of FIG. 1A. This generates a reduction of the electric field at the top surface 16a, and therefore a reduction of the leakage currents.

However, in each of these solutions the implanted regions 18 have a mutual distance $D_1$ which, during the design step of the JBS device 10, should be suitably chosen taking into account a trade-off between the threshold voltage $V_F$ in a forward conduction state, which is inversely proportional to the distance $D_1$, and the leakage current in a reverse conduction state, which is directly proportional to the distance $D_1$. In particular, the leakage current may be limited by reducing the distance $D_1$, increasing the extension of the implanted regions 18 in the semiconductor body 16, orthogonally to the top surface 16a, or using the implanted regions 18 of floating type (FIG. 1C).

Minimizing the leakage current in JBS devices 10 is desirable to reduce the overall energy consumption of power circuits and modules. However, the conventional solutions aim at optimizing the forward bias conduction, and this is carried out by reducing the voltage drop $V_F$ of the Schottky diodes 12 through a reduction of the Schottky barrier height value.

Due to this trade-off, these solutions, wherein the forward bias conduction is optimized, are ineffective from the overall energy consumption point of view. In fact, a reduction of the SBH value (currently a lower limit equal to about 1 eV has been reached) generates a respective reduction of the threshold voltage $V_F$, but also causes a significant increase in leakage current in reverse bias.

As a result, the need or desire is felt to develop a JBS device which is not limited by such trade-off, especially when it is used at high temperatures. In other words, it is desired to develop a JBS device which has a reduced voltage drop $V_F$ and a low leakage current, at the same time.

Figure 2:
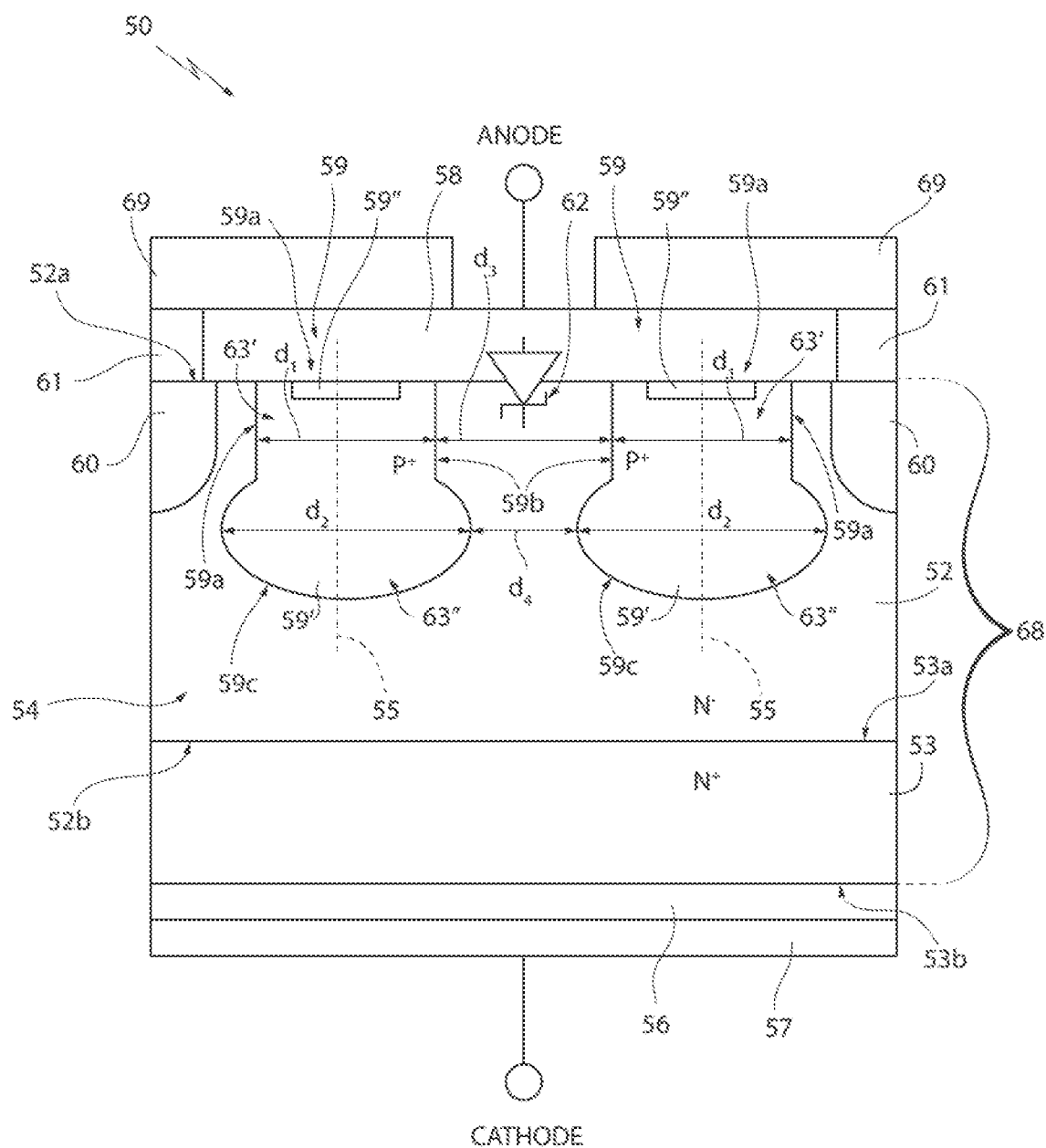
FIG. 2 shows, in cross-section view, a JBS device according to an embodiment of the present disclosure.

FIG. 2 shows, in lateral cross-section view in a (triaxial) Cartesian reference system of axes X, Y, Z, a Junction Barrier Schottky (JBS) device 50, according to an embodiment of the present disclosure.

In particular, the JBS device 50 is shown in FIG. 2 in an XZ-plane defined by the axes X and Z, and is comprised in an electrical/electronic apparatus (not shown, such as notebook, mobile phone, server, TV, automobile, automobile charging station or photovoltaic panel conversion system).

The JBS device 50 includes: a substrate 53, of SiC with a first type of electrical conductivity (in detail, of N-type), having a first dopant concentration, provided with a surface 53a opposite to a surface 53b, and thickness between the surfaces 53a and 53b comprised for example between 50 μm and 350 μm, more particularly between 160 μm and 200 μm, for example equal to 180 μm; a drift layer (optional, grown in an epitaxial manner) 52, of N-type SiC, having a second dopant concentration lower than the first dopant concentration and having a top surface 52a and a bottom surface 52b opposite to each other, the drift layer 52 extending on the surface 53a of the substrate 53 (in detail, the surfaces 53a and 52b are in contact with each other) and having a thickness between the surfaces 52a and 53b comprised for example between 5 and 15 μm; an ohmic contact region, or layer, 56 (optional, for example of nickel silicide), which extends on the surface 53b of the substrate 53; a cathode metallization 57 (optional), for example of Ti/NiV/Ag or Ti/NiV/Au, which extends on the ohmic contact region 56; an anode metallization 58, for example of Ti/AlSiCu or Ni/AlSiCu, which extends on the top surface 52a of the drift layer 52; a passivation layer 69 (optional) which extends on the anode metallization 58, to protect the latter; at least one implanted region 59' with a second type of electrical conductivity (different from the first type of electrical conductivity, and in detail of P-type, and in some embodiments of $P^+$-type) in the drift layer 52, facing the top surface 52a of the drift layer 52 and, for each implanted region 59', a respective ohmic contact 59" such that each implanted region 59' forms a respective Junction-Barrier (JB) element (or diode) 59 with the substrate 53; an edge termination region, or protection ring, 60 (optional), in particular an implanted region of P-type, which completely surrounds the JB elements 59; and an insulating layer 61 (optional) extending on the top surface 52a of the drift layer 52 in such a way that it completely surrounds the JB elements 59, is at least partially superimposed to the protection ring 60 and laterally delimits the anode metallization 58. In particular, the substrate 53 and the drift layer 52 form a semiconductor body 68 of the JBS device 50.

Furthermore, as discussed in the following, the at least one implanted region 59' may have a uniform dopant concentration in all its extension (e.g., higher than about $1·10^{18}$ at/cm$^3$).

One or more Schottky diodes 62 are formed at the interface between the drift layer 52 and the anode metallization 58, laterally to the implanted regions 59'. In particular, (semiconductor-metal) Schottky junctions are formed by portions of the drift layer 52 in direct electrical contact with respective portions of the anode metallization 58.

In particular, FIG. 2 exemplarily shows two implanted regions 59' which form, with the substrate 53, respective JB elements 59. In greater detail, the JB elements 59 are P-i-N diodes formed by the implanted regions 59', by the drift layer 52 and by the substrate 53. Although FIG. 2 shows two implanted regions 59', the number of implanted regions 59' may be different and, for example, greater than two.

The region of the JBS device 50 which includes the JB elements 59 and the Schottky diodes 62 (i.e., the region encompassed within the protection ring 60) is an active area 54 of the JBS device 50.

Each ohmic contact 59"' forms an electrical connection having a lower electrical resistivity value than the electrical resistivity value of the implanted region 59' accommodating it. The ohmic contacts 59"' are formed according to known techniques, and are not in direct physical contact with the drift layer 52 but are physically and electrically separated from the latter through the respective implanted regions 59'.

Each implanted region 59' has a first portion 63' and a second portion 63", electrically connected directly to each other. In detail, the first portion 63' and the second portion 63" are directly connected to each other both electrically and physically. The first portion 63' faces the top surface 52a of the drift layer 52, and extends into the semiconductor body 68 from the top surface 52a. The second portion 63" extends, in the semiconductor body 68, on the opposite side of the first portion 63' with respect to the top surface 52a of the drift layer 52. In other words, in parallel with the Z-axis, the first portion 63' is interposed between the top surface 52a of the drift layer 52 (and therefore the anode metallization 58) and the second portion 63". In greater detail, the first and the second portions 63', 63" of each implanted region 59' are aligned with each other along an alignment axis 55 parallel to the Z-axis and transverse (in detail, orthogonal) to the top surface 52a of the drift layer 52. The first and the second portions 63', 63" are therefore mutually connected to form the implanted region 59' thereof. In some embodiments, the first portion 63' and the second portion 63" of the implanted region 59' have respective dopant concentrations that are equal to each other.

Each first portion 63' has a first maximum width $d_1$, measured in parallel with the X-axis (and therefore transversely to the alignment axis 55), having a first value. Each second portion 63" has a second maximum width $d_2$, measured in parallel with the X-axis, having a second value greater than the first value (i.e., $d_2 > d_1$). As a result, the first portions 63' of the two implanted regions 59' of FIG. 2 have a first minimum distance $d_3$ between them, measured in parallel with the X-axis, having a third value, and the second portions 63" of the two implanted regions 59' of FIG. 2 have a second minimum distance $d_4$ between them, measured in parallel with the X-axis, having a fourth value smaller than the third value (i.e., $d_4 < d_3$).

In detail, the first and the second maximum widths $d_1$, $d_2$ are the widths of the first and, respectively, the second portions 63', 63" which are maximum among all the widths of the first and, respectively, the second portions 63', 63" measurable in parallel with the X-axis. Furthermore, the first and the second minimum distances $d_3$, $d_4$ are the mutual distances between the first and, respectively, the second portions 63', 63" of two JB elements 59 close to each other, which are minimum among all the mutual distances, measurable in parallel with the X-axis, between the first and, respectively, the second portions 63', 63" of two JB elements 59 close to each other.

In greater detail, in the embodiment of FIG. 2, each first portion 63' has a first and a second side surface 59a, 59b opposite to each other along the X-axis and adjacent to the top surface 52a of the drift layer 52. The side surfaces 59a, 59b of the same JB element 59 are distant from each other, for example at the anode metallization 58, by the first maximum width $d_1$. Two JB elements 59 close to each other have the respective second side surfaces 59b (or, alternatively, the respective first side surfaces 59a) facing each other and which are distant from each other, for example at the anode metallization 58, by the first minimum distance $d_3$. Furthermore, each second portion 63" is externally delimited by a third side wall 59c and has, in the XZ-plane, a substantially circular/elliptical profile with a diameter/major axis equal to the second maximum width $d_2$. In other words, each second portion 63" has ends which are opposite to each other along the X-axis and which have a respective mutual maximum distance equal to the second maximum width $d_2$. Two JB elements 59 close to each other have the respective third side surfaces 59c which are distant from each other by the second minimum distance $d_4$; i.e., the ends, facing each other, of the second portions 63" of two JB elements 59 close to each other are distant from each other by the second minimum distance $d_4$.

According to an aspect of the present disclosure, a first ratio $R_1$ between the second maximum width $d_2$ and the first maximum width $d_1$ is greater than 1 and smaller than, or equal to, about 2, i.e., $R_1 = d_2/d_1$ with for example $1 < R_1 \leq 2$. Furthermore, optionally a second ratio $R_2$ between the first minimum distance $d_3$ and the second minimum distance $d_4$ is greater than 1 and smaller than, or equal to, about 6, i.e., $R_2 = d_4/d_3$ with for example $1 < R_2 \leq 6$. For example, the first maximum width $d_1$ is comprised between about 1 μm and about 2 μm, and the second maximum width $d_2$ is comprised between about 1.1 μm and about 4 μm. Furthermore, the first minimum distance $d_3$ is comprised between about 2 μm and about 3 μm and the second minimum distance $d_4$ is comprised between about 0.5 μm and about 1.9 μm.

Figure 3B:
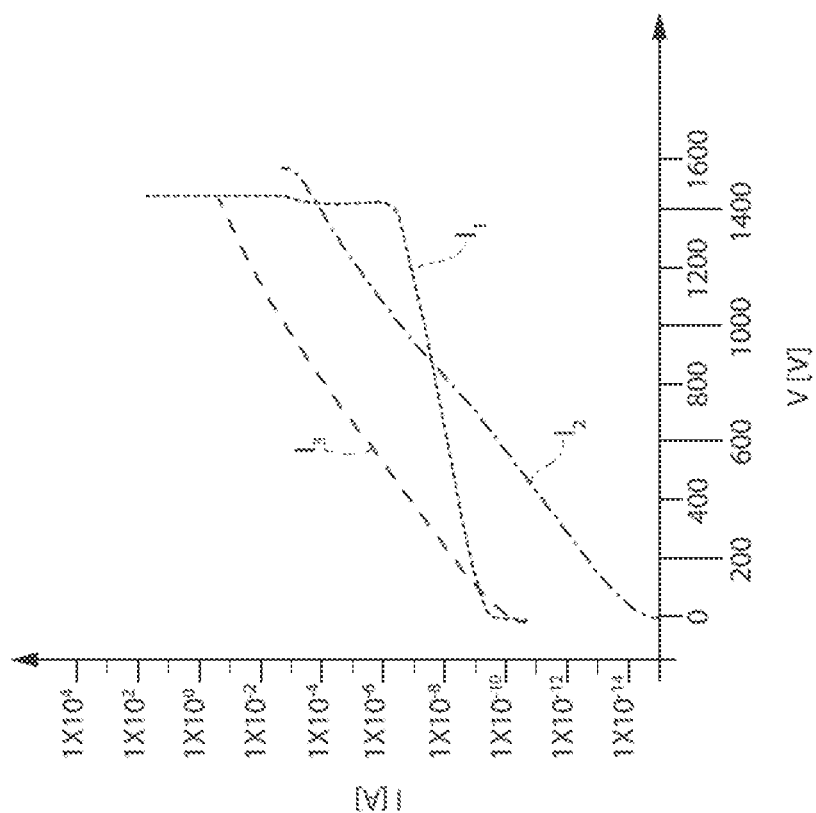
FIG. 3B is a graph showing the comparison between the current generated by the JBS device of FIG. 2 with respect to the currents generated by the JBS devices of known type, as the voltage applied thereon varies, when the JBS devices are in reverse conduction state.
Figure 3A:
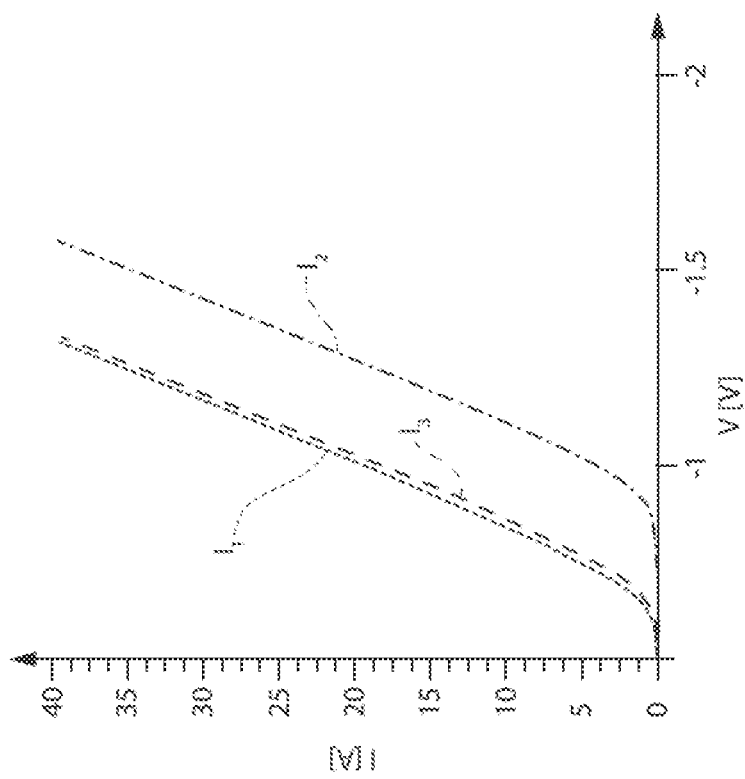
FIG. 3A is a graph showing the comparison between a current generated by the JBS device of FIG. 2 with respect to currents generated by JBS devices of known type, as a voltage applied thereon varies, when the JBS devices are in forward conduction state.

FIG. 3A shows the behavior of the current $I_1$ generated by the JBS device 50 (in detail, measured between anode and cathode), on the basis of the voltage V applied between the anode metallization 58 and the cathode metallization 57, when the JBS device 50 is in forward bias (or forward conduction state). In particular, the current $I_1$ is compared to the currents $I_2$ and $I_3$ generated by respective JBS devices of known type, where the JBS device corresponding to the current $I_2$ has a Schottky barrier height which is higher than the Schottky barrier height of the JBS device corresponding to the current $I_3$. With the same voltage V, the current $I_1$ is higher than the currents $I_2$ and $I_3$. As a result, the threshold voltage $V_F$ of the JBS device 50 is lower than that of the JBS devices of known type. FIG. 3B shows the behavior of the current $I_1$ of the JBS device 50 (in logarithmic scale), on the basis of the voltage V (in linear scale), when the JBS device 50 is in reverse bias (or reverse conduction state). It is noted how the current $I_1$ (which, in this case, represents the leakage current of the JBS device 50) has, throughout the working voltage range of the JBS device 50 (e.g., V<1200 V), an increase which is much less than the increase in the currents $I_2$ and $I_3$. For example, in the range of voltages V comprised between about 50 V and about 1200 V (the latter value being an example of maximum working voltage of the JBS device 50), the increase in the current $I_1$ varies between about $1 \cdot 10^{-10}$ A and about $1 \cdot 10^{-8}$ A, while the increase in the current $I_2$ varies between about $1 \cdot 10^{-14}$ A and about $1 \cdot 10^{-6}$ A and the increase in the current $I_3$ varies between about $1 \cdot 10^{-10}$ A and about $1 \cdot 10^{-3}$ A.

The JBS device 50 is manufactured according to a manufacturing process which is described hereinafter according to different embodiments of the latter.

With reference to FIGS. 4A-4D, the manufacturing steps of the JBS device 50 are described hereinafter, according to an embodiment of the manufacturing process.

Figure 4A:
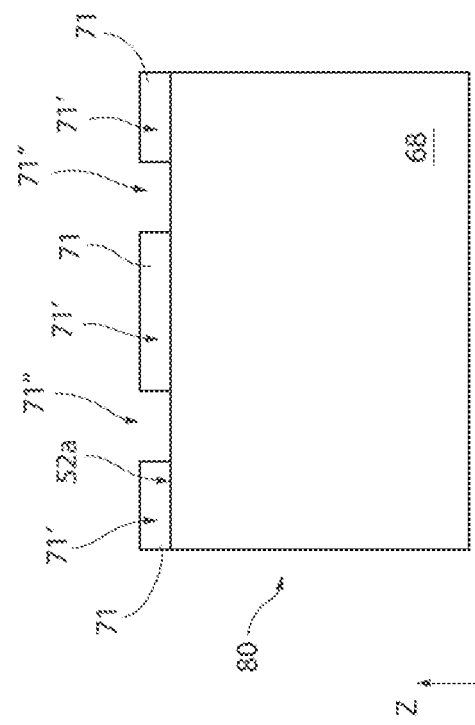
FIGS. 4A-4D show, in cross-section view, respective manufacturing steps of the JBS device of FIG. 2, according to an embodiment of manufacturing process.

With reference to FIG. 4A, a first wafer 80 including the semiconductor body 68 of Sic, is arranged. In particular, although it is not shown in FIG. 4A, the first wafer 80 comprises the substrate 53 of SiC (in particular 4H—SiC, however other polytypes may be used such as, but not limited to, 2H—SiC, 3C—SiC and 6H—SiC), on whose surface 53a the drift layer 52 is formed, for example through epitaxial growth. For example, the substrate 53 has a N-type dopant concentration comprised between $1 \cdot 10^{19}$ at/cm$^3$ and $1 \cdot 10^{22}$ at/cm$^3$, and has a thickness, measured along the Z-axis between the surfaces 53a and 53b, comprised between 50 μm and 360 μm, and in particular equal to about 180 μm; and the drift layer 52 (in 4H—SiC, but other polytypes of SiC, such as 2H, 6H, 3C or 15R, may be used) has a N-type dopant concentration which is lower than the doping level of the substrate 53, has a thickness, along the third Z-axis, comprised between 5 μm and 15 μm. A first hard mask 71 is formed on the top surface 52a of the semiconductor body 68, for example by depositing a photoresist, or TEOS, or another material suitable for the purpose. The first hard mask 71 has a thickness between 0.5 μm and 2 μm or in any case a thickness such that it shields the implants described hereinafter with reference to FIGS. 4B and 4D. The first hard mask 71 extends into a region of the first wafer 80 wherein, in successive steps, the active area 54 of the JBS device 50 will be formed. In plan view, on an XY-plane defined by the X- and Y-axes, the first hard mask 71 covers first regions 71' of the top surface 52a of the semiconductor body 68 which will form the Schottky diodes 62 and leaves exposed second regions 71'', adjacent to the first regions 71', of the top surface 52a of the semiconductor body 68 which will form the implanted regions 59'.

Figure 4B:
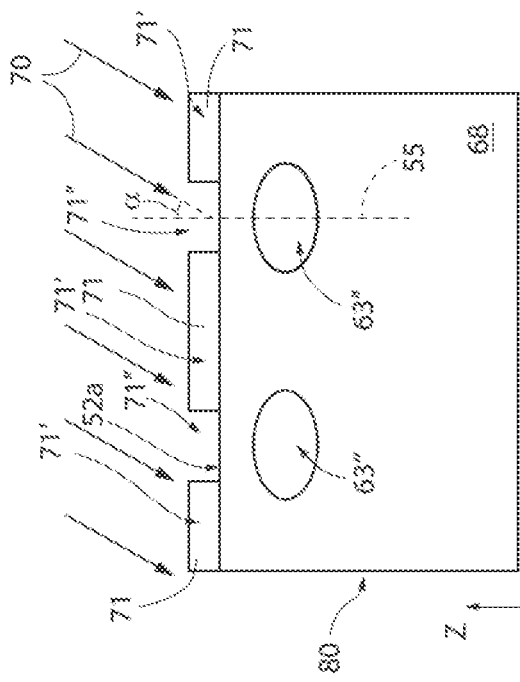

With reference to FIG. 4B, a step of first implant of one or more dopant species (in details a dopant species, for example boron or aluminum), which have the second type of conductivity (here, P), is then carried out, exploiting the first hard mask 71 (the first implant is indicated in figure by the arrows 70). The second portions 63'' of the implanted regions 59' are formed through the first implant 70. The first implant 70 is not carried out orthogonally to the top surface 52a of the semiconductor body 68, but is tilted with respect to the latter. According to an exemplary embodiment, the first implant 70 is carried out along an implant direction forming an angle α with respect to the Z-axis (and therefore with respect to the alignment axis 55). In detail, although FIG. 4B shows only one implant direction, the first implant 70 is carried out in two steps successive to each other, having respective implants having the respective implant directions that are symmetrical to each other with respect to the Z-axis and that form the respective angles +α and −α with the latter; in other words, the first implant 70 is carried out in two quadrants. In greater detail, the angle α is different from 0 and, in greater detail, it is, in absolute value, greater than 0° and smaller than, or equal to, about 20°.

In an exemplary embodiment, the step of first implant 70 comprises one or more implants of said one or more P-type dopant species, with implant energy comprised between about 200 keV and about 500 keV and with dose (implant dose) between about $1 \cdot 10^{12}$ at/cm$^2$ and about $1 \cdot 10^{16}$ at/cm$^2$, to form the second portions 63'' of the implanted regions 59' with a dopant concentration higher than about $1 \cdot 10^{18}$ at/cm$^3$. Thus, the second portions 63'' are formed, having a depth, measured from the top surface 52a of the semiconductor body 68, comprised between 0.4 μm and 1 μm.

Figure 4C:
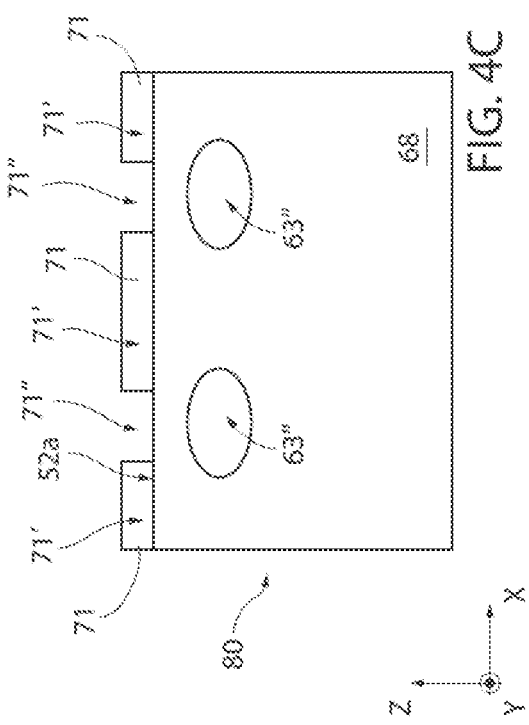

FIG. 4C shows the first wafer 80 at the end of the first implant 70, where the second portions 63'' of the implanted regions 59' have been formed.

Figure 4D:
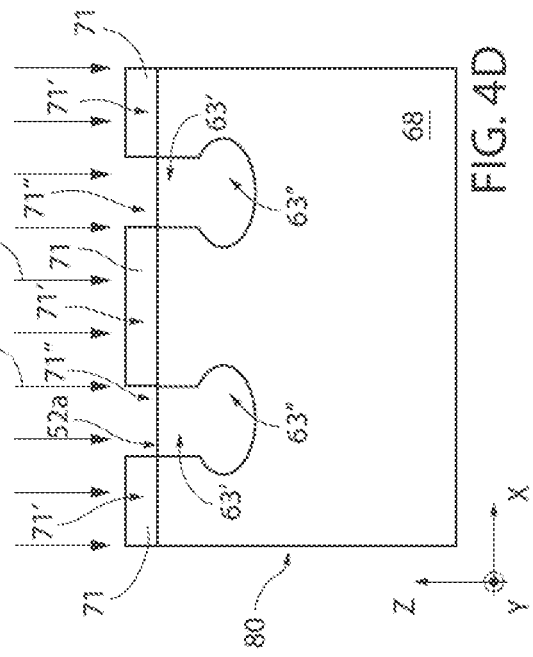

With reference to FIG. 4D, a step of second implant of one or more dopant species (in detail, the same as the first implant 70; in greater detail, the same dopant species as the first implant 70, for example with the same implant dose as the first implant 70, i.e. the implant doses of the first implant 70 and the second implant 72 are the same) is then carried out, exploiting the first hard mask 71 (the second implant is indicated in figure by the arrows 72). The first portions 63' of the implanted regions 59' are formed through the second implant 72. During the step of FIG. 4D, the protection ring 60, if any, is also formed. In some embodiments, the dopant species of the first and second portions of the implanted regions is a same, single dopant species.

In an exemplary embodiment, the second implant 72 is carried out orthogonally to the top surface 52a of the semiconductor body 68 (i.e., substantially in parallel with the Z-axis) and comprises one or more implants of said one or more P-type dopant species, with implant energy comprised between about 30 keV and about 200 keV and with dose between about $1 \cdot 10^{12}$ at/cm$^2$ and about $1 \cdot 10^{16}$ at/cm$^2$, to form the first portions 63' of the implanted regions 59' with a dopant concentration higher than about $1 \cdot 10^{18}$ at/cm$^3$. Thus, the first portions 63' are formed, having a depth, measured from the top surface 52a of the semiconductor body 68, up to about 0.6 μm.

Since the first hard mask 71 is common to both the first implant 70 and the second implant 72, the first implant 70 is tilted and the second implant 72 is not tilted, the first and the second portions 63' and 63'' have widths along the X-axis which are different from each other due to known trigonometric considerations, and in particular the first maximum width $d_1$ is smaller than the second maximum width $d_2$.

In successive steps, not shown, the first hard mask 71 is removed and a thermal annealing step is carried out, at the top surface 52a of the semiconductor body 68, for the activation of the one or more dopant species implanted in the steps of FIGS. 4B and 4D. The thermal annealing is, for example, carried out at a temperature higher than 1500° C. (for example, between 1700° C. and 1900° C.).

According to per se known techniques, the ohmic contacts 59'' and the insulating layer 61, if any, are then formed. The insulating layer 61 is at least partially superimposed to the protection ring 60 and with the latter defines the active area 54 of the JBS device 50.

The ohmic contact layer 56 from the surface 53b of the substrate 53, the cathode metallization 57 from the ohmic contact layer 56, and the anode metallization 58 on the top surface 52a of the semiconductor body 68, are then formed in succession to each other. For example, Ti/AlSiCu or Ni/AlSiCu is deposited on the top surface 52a of the semiconductor body 68 in such a way that the anode metallization 58 contacts the drift layer 52 and the JB elements 59.

The passivation layer 69 is then formed on the anode metallization 58 and on the insulating layer 61, obtaining the JBS device 50 shown in FIG. 2.

With reference to FIGS. 5A-5D, the manufacturing steps of the JBS device 50 are described hereinafter, according to an embodiment of the manufacturing process different from that described with reference to FIGS. 4A-4D.

Figure 5B:
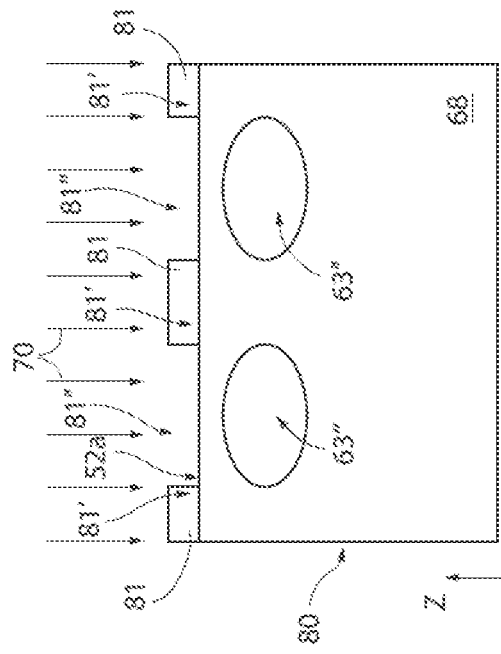
FIGS. 5A-5D show, in cross-section view, respective manufacturing steps of the JBS device of FIG. 2, according to a different embodiment of manufacturing process.
Figure 5D:
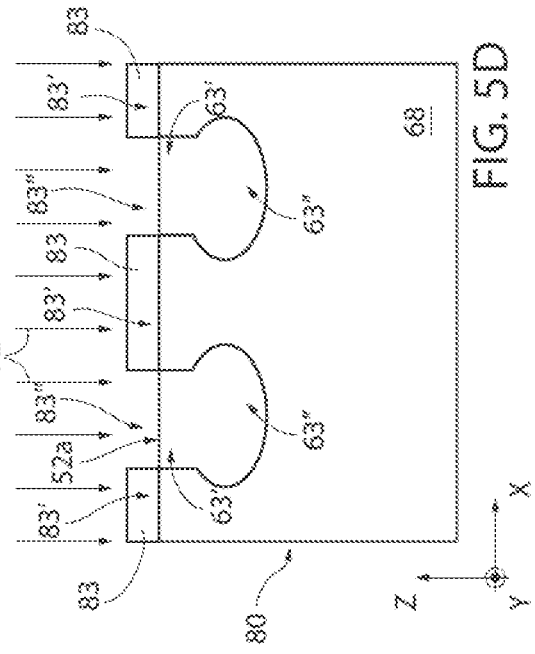
Figure 5A:
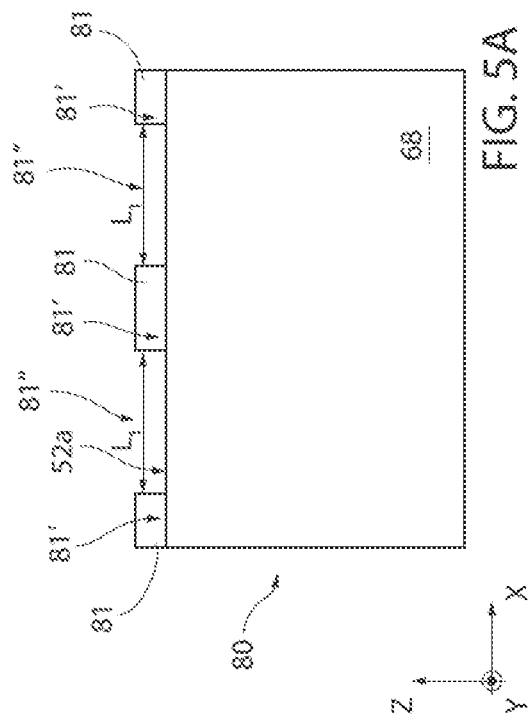

With reference to FIG. 5A, the first wafer 80 including the semiconductor body 68 of SiC is arranged, as previously described.

A second hard mask 81 is formed on the top surface 52a of the semiconductor body 68, for example by depositing a photoresist, or TEOS, or another material suitable for the purpose. The second hard mask 81 has a thickness between 0.5 µm and 2 µm or in any case a thickness such that it shields the implant described hereinafter with reference to FIG. 5B. In plan view, on the XY-plane, the second hard mask 81 covers third regions 81' of the top surface 52a of the semiconductor body 68 which will form the Schottky diodes 62 and leaves exposed fourth regions 81", adjacent to the third regions 81', of the top surface 52a of the semiconductor body 68 which will form the implanted regions 59' and part of the Schottky diodes 62. In particular, each fourth region 81" has a respective first width $L_1$, measured along the X-axis, for example at the top surface 52a of the semiconductor body 68.

With reference to FIG. 5B, the step of first implant 70 of the one or more dopant species is then carried out, exploiting the second hard mask 81. The second portions 63" of the implanted regions 59' are formed through the first implant 70. In the present embodiment, the first implant 70 is carried out orthogonally to the top surface 52a of the semiconductor body 68, and therefore is not tilted as previously described with respect to the latter. At the end of the first implant 70 the second hard mask 81 is removed.

Figure 5C:
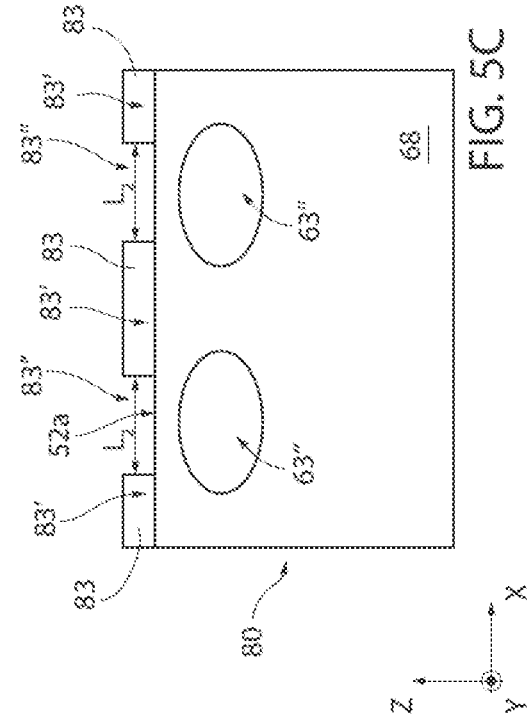

With reference to FIG. 5C, a third hard mask 83 is formed on the top surface 52a of the semiconductor body 68, for example by depositing a photoresist, or TEOS, or other material suitable for the purpose. The third hard mask 83 has a thickness between 0.5 µm and 2 µm or in any case a thickness such that it shields the implant described hereinafter with reference to FIG. 5D. In plan view, on the XY-plane, the third hard mask 83 covers fifth regions 83' of the top surface 52a of the semiconductor body 68 which will form the Schottky diodes 62 and leaves exposed sixth regions 83", adjacent to the fifth regions 83', of the top surface 52a of the semiconductor body 68 which will form the implanted regions 59'. In particular, the third hard mask 83 is the same as the first hard mask 71 previously described, and therefore the fifth and sixth regions 83' and 83" coincide with the first and second regions 71' and 71". In greater detail, each sixth region 83" has a respective second width $L_2$, measured along the X-axis for example at the top surface 52a of the semiconductor body 68. The second widths $L_2$ are smaller than the first widths $L_1$.

With reference to FIG. 5D, the step of second implant 72 of one or more dopant species is then carried out, exploiting the third hard mask 83. Similarly to what has been described with reference to FIG. 4D, the first portions 63' of the implanted regions 59' are formed through the second implant 72.

Since the second and the third hard masks 81 and 83 are different from each other (in detail, since $L_2<L_1$), the first and the second portions 63' and 63" have widths along the X-axis which are different from each other, and in particular the first maximum width $d_1$ is smaller than the second maximum width $d_2$.

Similarly to what has been previously described, the further not-shown steps then follow, which lead to the JBS device 50 of FIG. 2.

With reference to FIGS. 6A-6E, the manufacturing steps of the JBS device 50 are described hereinafter, according to an embodiment of the manufacturing process different from those described with reference to FIGS. 4A-5D.

With reference to FIG. 6A, a second wafer 90 of SiC is arranged, comprising the substrate 53 and at least part of the drift layer 52 and having a top surface 90a and a bottom surface 90b opposite to each other along the Z-axis. The second hard mask 81 is formed on the top surface 90a of the second wafer 90, as previously described.

With reference to FIG. 6B, a step of third implant 94 of the one or more dopant species (in detail, the same as the first implant 70 and of the second implant 72; in greater detail, the same dopant species with the same implant dose and implant energy of the second implant 72) is carried out, exploiting the second hard mask 81. The second portions 63" of the implanted regions 59' are formed through the third implant 94. At the end of the third implant 94 the second hard mask 81 is removed.

In an exemplary embodiment, the third implant 94 is carried out orthogonally to the top surface 90a of the second wafer 90 (i.e., substantially in parallel with the Z-axis) and comprises one or more implants of the one or more P-type dopant species, with implant energy comprised between about 30 keV and about 200 keV and with doses between about $1·10^{12}$ at/cm$^2$ and about $1·10^{16}$ at/cm$^2$, to form the second portions 63" of the implanted regions 59' with a dopant concentration higher than about $1·10^{18}$ at/cm$^3$. Thus, the second portions 63" are formed having a depth, measured from the top surface 90a of the second wafer 90, up to about 0.6 µm.

With reference to FIG. 6C, an epitaxial layer 95 of SiC is formed on the top surface 90a of the second wafer 90, for example through epitaxial growth. The epitaxial layer 95 forms, with the second wafer 90, the semiconductor body 68 and, as a result, defines the top surface 52a of the semiconductor body 68 (which is opposite to the top surface 90a of the second wafer 90 with respect to the epitaxial layer 95). In detail, the epitaxial layer 95 may be part of the drift layer 52 or be placed on the drift layer 52 to form, with the latter and the substrate 53, the semiconductor body 68. For example, the epitaxial layer 95 has a N-type dopant concentration equal to that of the drift layer 52 or greater than that of the drift layer 52 (e.g., comprised between about $5·10^{15}$ at/cm$^3$ and about $5·10^{16}$ at/cm$^3$), and has a thickness, measured along the Z-axis between the surfaces 53a and 53b, comprised between about 0.5 µm and about 2 µm, and in particular equal to about 1 µm.

With reference to FIG. 6D, the third hard mask 83 is formed on the top surface 52a of the semiconductor body 68 (i.e., on the epitaxial layer 95), as previously described. As a result, each sixth region 83" has the respective second width $L_2$ which is smaller than the first width $L_1$ of each fifth region 83'.

Figure 6E:
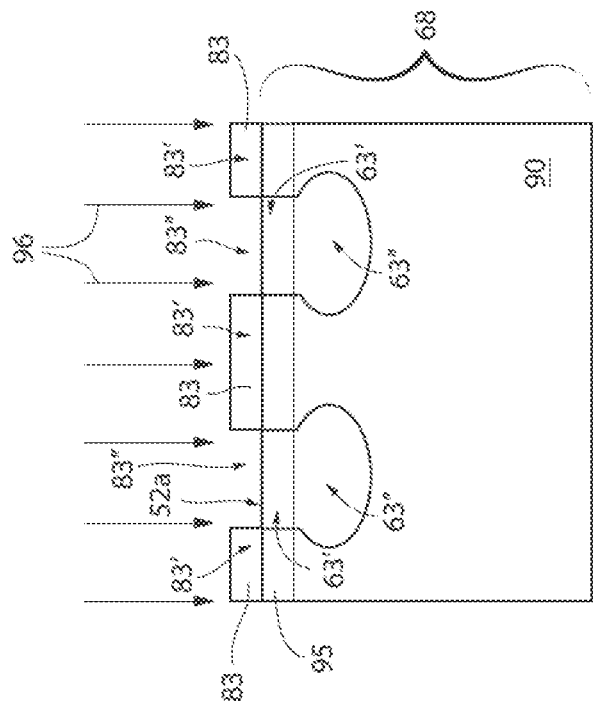

With reference to FIG. 6E, a step of fourth implant 96, similar to the second implant 72 (and in some embodiments with the same dopant species of the second implant 72 and, in greater detail, of the same dopant species with the same implant dose and implant energy of the second implant 72), is then carried out, exploiting the third hard mask 83. Similarly to what has been described with reference to FIG. 4D, the first portions 63' of the implanted regions 59' are formed through the fourth implant 96.

Since the second and the third hard masks 81 and 83 are different from each other (in detail, since $L_2<L_1$), the first and the second portions 63' and 63" have widths along the X-axis which are different from each other, and in particular the first maximum width $d_1$ is smaller than the second maximum width $d_2$.

Similarly to what has been previously described, the further not-shown steps then follow, which lead to the JBS device 50 of FIG. 2.

From an examination of the features of the disclosure made according to the present disclosure, the advantages it allows to obtain are apparent.

In particular, it has been verified that the JBS device 50 allows the leakage current in the reverse conduction state to be reduced without the current performances in the forward conduction state being significantly affected, since the amount of leakage current is less related to the area of the Schottky diodes 62 with respect to the case of JBS devices of known type. This occurs due to the previously described shape of the implanted regions 59'.

In fact, since the second maximum width $d_2$ is greater than the first maximum width $d_1$, the pinch-off effect increases (due to the second portions 63") without it being necessary to move the implanted regions 59' excessively close to each other (i.e., excessively reduce the first minimum distance $d_3$) and therefore without having to reduce the area of the Schottky diodes 62 and the resulting current flow in forward conduction state. In greater detail, with the same distance between implanted regions 59' close to each other, the JBS device 50 suffices a lower pinch-off with respect to that required for JBS devices of known type, to limit the electrical field at the top surface 52a of the semiconductor body 68 with the same effectiveness.

Furthermore, carrying out the pinch-off at a distance from the top surface 52a of the semiconductor body 68 allows the electric field at the top surface 52a of the semiconductor body 68 to be reduced even more effectively, due to the known decrease of the electric field between two objects as the distance therebetween increases. As a result, the leakage current in reverse conduction state decreases even more significantly.

In other words, the combined pinch-off effect of the first and the second portions 63' and 63" allows the leakage current of the JBS device 50 to be effectively reduced, especially at high operating temperatures of the JBS device 50.

Furthermore, the previously described manufacturing process allows the JBS device 50 to be manufactured in a simple and economical manner.

In particular, the embodiment of the manufacturing process discussed with reference to FIGS. 4A-4D allows the use of a single hard mask, while the embodiment of the manufacturing process discussed with reference to FIGS. 6A-6E allows the use of implant steps at low energies only. Furthermore, in case the epitaxial layer 95 has a higher dopant concentration than that of the drift layer 52, the threshold voltage $V_F$ of the JBS device 50 in forward conduction state is further reduced.

Furthermore, the JBS 50 device has the implanted regions 59' having a single dopant species and a same dopant concentration. In other words, the first and second portions 63' and 63" of the implanted regions 59' have the same dopant and the same dopant concentration (i.e., they are of $P^+$-type). This simplifies the manufacturing process and improves the electrical performance of the JBS 50 device. Furthermore, the absence of different dopant species in the different portions 63' and 63" of the implanted regions 59' causes the shape of the implanted regions 59' to depend solely on the size of the openings of the masks 71, 81, 83 and to be instead independent from the chosen temperature for the annealing step (as would happen in the case of using different dopant species in the different portions of the implanted regions 59').

Furthermore, in embodiments in which the first implant 70 is performed along the implant direction forming the angle α with respect to the Z axis, the angle α is specific for the JBS 50 device in SiC. In fact, it is known that the known angled implantation techniques for silicon cannot be effectively used for SiC devices due to the different thermal diffusion coefficients of the dopant species between Si and SiC (e.g., "Silicon Carbide Power Devices" by B. Jayant Baliga, 2006).

Finally, it is clear that modifications and variations may be made to the disclosure described and illustrated herein without thereby departing from the scope of protection of the present disclosure, as defined in the attached claims.

In particular, the electrical/electronic apparatus may comprise a plurality of JBS devices 50.

The JBS device 50 may comprise a plurality of implanted regions 59' which define respective Schottky diodes 62 and JB elements 59 which are arranged in the XY-plane, alternated to each other, to form an array or a matrix.

In addition, the implanted regions 59' may have different shapes with respect to that previously described, as long as the mutual relationship between the maximum widths $d_1$ and $d_2$ ($d_1<d_2$) is valid. For example, each second portion 63" may have a substantially polygonal (e.g., square or trapezoidal) shape, and each first portion 63' may have a substantially circular or ellipsoidal or trapezoidal shape.

A Junction Barrier Schottky, JBS, device (50) may be summarized as including a semiconductor body (68) of silicon carbide having a first type of electrical conductivity; a first implanted region (59') having a second type of electrical conductivity opposite to the first type of electrical conductivity and extending into the semiconductor body (68) at a top surface (52a) of the semiconductor body (68), so as to form a first junction barrier, JB, diode (59) with the semiconductor body (68); and a first electrical terminal (58) in ohmic contact with the first implanted region (59') and in direct electrical contact with the top surface (52a) of the semiconductor body (68), laterally to the first implanted region (59'), so as to form a Schottky diode (62) with the semiconductor body (68), wherein the first implanted region (59') is formed by a first portion (63') and by a second portion (63") electrically connected directly to each other and aligned with each other along a first alignment axis (55) transverse to the top surface (52a) of the semiconductor body (68), the first portion (63') of the first implanted region (59') extending, along the first alignment axis (55), between the second portion (63") of the first implanted region (59') and the first electrical terminal (58), wherein the first portion (63') of the first implanted region (59') has, orthogonally to the first alignment axis (55), a maximum width having a first value ($d_1$), and wherein the second portion (63") of the first implanted region (59') has, orthogonally to the first alignment axis (55), a respective maximum width having a second value ($d_2$) greater than the first value ($d_1$).

The first portion (63') of the first implanted region (59') may have side walls (59a, 59b) opposite to each other along a first axis (X) transverse to the first alignment axis (55), the side walls (59a, 59b) of the first portion (63') of the first implanted region (59') having a mutual maximum distance having the first value ($d_1$), and wherein the second portion (63") of the first implanted region (59') may have ends which are opposite to each other along the first axis (X) and which have a respective mutual maximum distance having the second value ($d_2$).

The semiconductor body (68) may include a substrate (53) and a drift layer (52) superimposed to the substrate (53) and defining said top surface (52a) of the semiconductor body (68), opposite to the substrate (53) with respect to the drift layer (52), and wherein the first implanted region (59') may extend into the drift layer (52).

A ratio ($R_1$) between the second value ($d_2$) and the first value ($d_1$) may be greater than 1 and smaller than, or equal to, 2.

The JBS device may further include at least one second implanted region (59') having the second type of electrical conductivity and extending into the semiconductor body (68) at the top surface (52a) of the semiconductor body (68) and laterally to the first implanted region (59'), so as to form a respective second junction barrier, JB, diode (59) with the semiconductor body (68), wherein the first electrical terminal (58) is also in ohmic contact with the at least one second implanted region (59'), wherein the at least one second implanted region (59') is formed by a respective first portion (63') and by a respective second portion (63") electrically connected directly to each other and aligned to each other along a second alignment axis (55) transverse to the top surface (52a) of the semiconductor body (68), the first portion (63') of the second implanted region (59') extending, along the first alignment axis (55), between the second portion (63") of the second implanted region (59') and the first electrical terminal (58), wherein the first portion (63') of the second implanted region (59') has, orthogonally to the second alignment axis (55), a respective maximum width having the first value ($d_1$), and wherein the second portion (63") of the second implanted region (59') has, orthogonally to the second alignment axis (55), a respective maximum width having the second value ($d_2$).

The respective first portion (63') of the at least one second implanted region (59') may have respective side walls (59a, 59b) opposite to each other along the first axis (X) transverse to the first and the second alignment axes (55), the side walls (59a, 59b) of the first portion (63') of the at least one second implanted region (59') having a respective mutual maximum distance having the first value ($d_1$), wherein the second portion (63") of the at least one second implanted region (59') may have respective ends which are opposite to each other along the first axis (X) and which have a respective mutual maximum distance having the second value ($d_2$), wherein the side walls (59a, 59b) of the first portion (63') of the first implanted region (59') and of the first portion (63') of the at least one second implanted region (59'), which face each other, may have a respective mutual minimum distance having a third value ($d_3$), and wherein the ends of the second portion (63") of the first implanted region (59') and of the second portion (63') of the at least one second implanted region (59'), which face each other, may have a respective mutual minimum distance having a fourth value ($d_4$) smaller than the third value ($d_3$).

An electrical/electronic apparatus may be summarized as including at least one Junction Barrier Schottky, JBS, device (50).

A manufacturing process of a Junction Barrier Schottky, JBS, device (50), may be summarized as including the steps of forming, in a semiconductor body (68) of silicon carbide having a first type of electrical conductivity, a first implanted region (59') having a second type of electrical conductivity opposite to the first type of electrical conductivity and extending into the semiconductor body (68) at a top surface (52a) of the semiconductor body (68), so as to form a first junction barrier, JB, diode (59) with the semiconductor body (68); and forming a first electrical terminal (58) in ohmic contact with the first implanted region (59') and in direct electrical contact with the top surface (52a) of the semiconductor body (68), laterally to the first implanted region (59'), so as to form a Schottky diode (62) with the semiconductor body (68), wherein the step of forming the first implanted region (59') includes forming in the semiconductor body (68) a first portion (63') and a second portion (63") of the first implanted region (59'), electrically connected directly to each other and aligned with each other along a first alignment axis (55) transverse to the top surface (52a) of the semiconductor body (68), the first portion (63') of the first implanted region (59') extending, along the first alignment axis (55), between the second portion (63") of the first implanted region (59') and the first electrical terminal (58), wherein the first portion (63') of the first implanted region (59') has, orthogonally to the first alignment axis (55), a maximum width having a first value ($d_1$), and wherein the second portion (63") of the first implanted region (59') has, orthogonally to the first alignment axis (55), a respective maximum width having a second value ($d_2$) greater than the first value ($d_1$).

The step of forming the first portion (63') and the second portion (63") of the first implanted region (59') may include forming, on the top surface (52a) of the semiconductor body (68), a hard mask (71) which exposes a region (71") of the top surface (52a); performing a first implant (70) of dopant species in the semiconductor body (68), at said region (71"), so as to form the second portion (63") of the first implanted region (59'); and performing a second implant (72) of dopant species in the semiconductor body (68), at said region (71"), so as to form the first portion (63') of the first implanted region (59'), wherein the first implant (70) is performed along an implant direction forming an angle ($\alpha$) with respect to the first alignment axis (55), and the second implant (72) is carried out in parallel with the first alignment axis (55).

The step of forming the first portion (63') and the second portion (63") of the first implanted region (59') may include forming, on the top surface (52a) of the semiconductor body (68), a first hard mask (81) which exposes a first region (81") of the top surface (52a); performing a first implant (70) of dopant species in the semiconductor body (68), at said first region (81"), so as to form the second portion (63") of the first implanted region (59'); forming, on the top surface (52a) of the semiconductor body (68), a second hard mask (83) which exposes a second region (83") of the top surface (52a), which is included in the first region (81"); and performing a second implant (72) of dopant species in the semiconductor body (68), at said second region (83"), so as to form the first portion (63') of the first implanted region (59'), wherein the first region (81") has, orthogonally to the first alignment axis (55), a respective maximum width having a third value ($L_1$) and the second region (83") has, orthogonally to the first alignment axis (55), a respective maximum width having a fourth value ($L_2$) smaller than the third value ($L_1$).

The first implant (70) may be performed through one or more implants of said dopant species, with implant energy include between 200 keV and 500 keV and with doses included between $1 \cdot 10^{12}$ at/cm² and $1 \cdot 10^{16}$ at/cm², and wherein the second implant (72) may be carried out through one or more implants of said dopant species, with implant energy included between 30 keV and 200 keV and with doses included between $1 \cdot 10^{12}$ at/cm² and $1 \cdot 10^{16}$ at/cm².

The step of forming the first portion (63') and the second portion (63") of the first implanted region (59') may include forming, on a first surface (90a) of a wafer (90) of silicon carbide having the first type of electrical conductivity, a first hard mask (81) which exposes a first region (81") of the first surface (90a); performing a first implant (94) of dopant species in the wafer (90), at said first region (81"), so as to form the second portion (63") of the first implanted region (59'); forming, on the first surface (90a) of the wafer (90), an epitaxial layer (95) of silicon carbide having the first type of electrical conductivity and defining, with the wafer (90), the semiconductor body (68); forming, on the epitaxial layer (95), a second hard mask (83) which exposes a second region (83") of the top surface (52a) of the semiconductor body (68), the second region (83") being included in the first region (81"); and performing a second implant (96) of dopant species in the epitaxial layer (95), at said second region (83"), so as to form the first portion (63') of the first implanted region (59'), wherein the first region (81") has, orthogonally to the first alignment axis (55), a respective maximum width having a third value ($L_1$) and the second region (83") has, orthogonally to the first alignment axis (55), a respective maximum width having a fourth value ($L_2$) smaller than the third value ($L_1$).

The first implant (94) and the second implant (96) may be performed through one or more implants of said dopant species, with implant energy included between 30 keV and 200 keV and with doses included between $1 \cdot 10^{12}$ at/cm² and $1 \cdot 10^{16}$ at/cm².

The step of forming the epitaxial layer (95) may include performing an epitaxial growth with dopant concentration included between $5 \cdot 10^{15}$ at/cm³ and $5 \cdot 10^{16}$ at/cm³.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A Junction Barrier Schottky (JBS) device, comprising:
a semiconductor body of silicon carbide having a first type of electrical conductivity;
a first implanted region having a second type of electrical conductivity opposite to the first type of electrical conductivity and extending into the semiconductor body from a top surface of the semiconductor body, the first implanted region forming a first junction barrier (JB) diode with the semiconductor body;
a first electrical terminal in contact with the first implanted region and in direct electrical contact with the top surface of the semiconductor body, laterally to the first implanted region, the first electrical terminal forming a Schottky diode with the semiconductor body; and
an ohmic contact within the first implanted region and in contact with the first electrical terminal,
wherein the first implanted region physically and electrically separates the ohmic contact from the semiconductor body,
wherein an electrical resistivity value of the ohmic contact is lower than an electrical resistivity value of the first impalnted region,
wherein the first implanted region includes a first portion and a second portion electrically connected directly to each other and aligned with each other along a first alignment axis transverse to the top surface of the semiconductor body, the first portion of the first implanted region extending, along the first alignment axis, between the second portion of the first implanted region and the first electrical terminal,
wherein the first portion of the first implanted region has, orthogonally to the first alignment axis, a maximum width having a first value, and
wherein the second portion of the first implanted region has, orthogonally to the first alignment axis, a respective maximum width having a second value greater than the first value.

2. The JBS device according to claim 1, wherein the first portion of the first implanted region has side walls opposite to each other along a first axis transverse to the first alignment axis, the side walls of the first portion of the first implanted region having a mutual maximum distance having the first value, and
wherein the second portion of the first implanted region has ends which are opposite to each other along the first axis and which have a respective mutual maximum distance having the second value.

3. The JBS device according to claim 1, wherein the semiconductor body includes a substrate and a drift layer on the substrate, the drift layer defining the top surface of the semiconductor body opposite to the substrate, and
wherein the first implanted region extends into the drift layer.

4. The JBS device according to claim 1, wherein a ratio between the second value and the first value is greater than 1 and less than or equal to 2.

5. The JBS device according to claim 1, further comprising at least one second implanted region having the second type of electrical conductivity and extending into the semiconductor body from the top surface of the semiconductor body and laterally to the first implanted region, the at least one second implanted region forming a respective second junction barrier (JB) diode with the semiconductor body,
wherein the first electrical terminal is in ohmic contact with the at least one second implanted region,
wherein the at least one second implanted region includes a respective first portion and a respective second portion electrically connected directly to each other and aligned to each other along a second alignment axis transverse to the top surface of the semiconductor body, the first portion of the second implanted region extending, along the first alignment axis, between the second portion of the second implanted region and the first electrical terminal,
wherein the first portion of the second implanted region has, orthogonally to the second alignment axis, a respective maximum width having the first value, and wherein the second portion of the second implanted region has, orthogonally to the second alignment axis, a respective maximum width having the second value.

6. The JBS device according to claim 5, wherein the first portion of the first implanted region has side walls opposite to each other along a first axis transverse to the first alignment axis, the side walls of the first portion of the first implanted region having a mutual maximum distance having the first value, wherein the second portion of the first implanted region has ends which are opposite to each other along the first axis and which have a respective mutual maximum distance having the second value, wherein the respective first portion of the at least one second implanted region has respective side walls opposite to each other along the first axis transverse to the first and the second alignment axes, the side walls of the first portion of the at least one second implanted region having a respective mutual maximum distance having the first value, wherein the second portion of the at least one second implanted region has respective ends which are opposite to each other along the first axis and which have a respective mutual maximum distance having the second value, wherein the side walls of the first portion of the first implanted region and of the first portion of the at least one second implanted region, which face each other, have a respective mutual minimum distance having a third value, and wherein the ends of the second portion of the first implanted region and of the second portion of the at least one second implanted region, which face each other, have a respective mutual minimum distance having a fourth value smaller than the third value.

7. The JBS device according to claim 1, wherein the first portion and the second portion of the first implanted region are formed of a same dopant species.

8. The JBS device according to claim 1, wherein a dopant concentration of the first portion of the first implanted region is equal to a dopant concentration of the second portion of the first implanted region.

9. An apparatus, comprising:
at least one Junction Barrier Schottky (JBS) device including:
a semiconductor body of silicon carbide having a first type of electrical conductivity;
a first implanted region having a second type of electrical conductivity opposite to the first type of electrical conductivity and extending into the semiconductor body from a top surface of the semiconductor body, the first implanted region forming a first junction barrier (JB) diode with the semiconductor body; and
a first electrical terminal in ohmic contact with the first implanted region and in direct electrical contact with the top surface of the semiconductor body, laterally to the first implanted region, the first electrical terminal forming a Schottky diode with the semiconductor body; and
an ohmic contact within the first implanted region and in contact with the first electrical terminal,
wherein the first implanted region physically and electrically separates the ohmic contact from the semiconductor body,
wherein an electrical resistivity value of the ohmic contact is lower than an electrical resistivity value of the first implanted region,
wherein the first implanted region includes a first portion and a second portion electrically connected directly to each other and aligned with each other along a first alignment axis transverse to the top surface of the semiconductor body, the first portion of the first implanted region extending, along the first alignment axis, between the second portion of the first implanted region and the first electrical terminal,
wherein the first portion of the first implanted region has, orthogonally to the first alignment axis, a maximum width having a first value, and
wherein the second portion of the first implanted region has, orthogonally to the first alignment axis, a respective maximum width having a second value greater than the first value.

10. The apparatus according to claim 9, wherein the first portion of the first implanted region has side walls opposite to each other along a first axis transverse to the first alignment axis, the side walls of the first portion of the first implanted region having a mutual maximum distance having the first value, and wherein the second portion of the first implanted region has ends which are opposite to each other along the first axis and which have a respective mutual maximum distance having the second value.

11. The apparatus according to claim 9, wherein a dopant concentration of the first portion of the first implanted region is equal to a dopant concentration of the second portion of the first implanted region.

12. A manufacturing process of a Junction Barrier Schottky (JBS) device, comprising:
forming, in a semiconductor body of silicon carbide having a first type of electrical conductivity, a first implanted region having a second type of electrical conductivity opposite to the first type of electrical conductivity and extending into the semiconductor body from a top surface of the semiconductor body, the first implanted region forming a first junction barrier (JB) diode with the semiconductor body;
forming, in the first implanted region, an ohmic contact; and
forming a first electrical terminal in contact with the ohmic contact and the first implanted region and in direct electrical contact with the top surface of the semiconductor body, laterally to the first implanted region, the first electrical terminal forming a Schottky diode with the semiconductor body,
wherein an electrical resistivity value of the ohmic contact is lower than an electrical resistivity value of the first implanted region,
wherein the forming the first implanted region includes forming in the semiconductor body a first portion and a second portion of the first implanted region, electrically connected directly to each other and aligned with each other along a first alignment axis transverse to the top surface of the semiconductor body, the first portion of the first implanted region extending, along the first alignment axis, between the second portion of the first implanted region and the first electrical terminal,
wherein the first portion of the first implanted region has, orthogonally to the first alignment axis, a maximum width having a first value, and wherein the second portion of the first implanted region has, orthogonally to the first alignment axis, a respective maximum width having a second value greater than the first value.

13. The manufacturing process according to claim 12, wherein the forming the first portion and the second portion of the first implanted region comprises:
   forming, on the top surface of the semiconductor body, a hard mask which exposes a region of the top surface;
   forming the second portion of the first implanted region by performing a first implant of a dopant species in the semiconductor body at an exposed region; and
   forming the first portion of the first implanted region by performing a second implant of the dopant species in the semiconductor body at the exposed region,
   wherein the first implant is performed along an implant direction forming an angle with respect to the first alignment axis, and the second implant is performed in parallel with the first alignment axis.

14. The manufacturing process according to claim 12, wherein the forming the first portion and the second portion of the first implanted region comprises:
   forming, on the top surface of the semiconductor body, a first hard mask which exposes a first region of the top surface;
   forming the second portion of the first implanted region by performing a first implant of a dopant species in the semiconductor body at the first region;
   forming, on the top surface of the semiconductor body, a second hard mask which exposes a second region of the top surface, which is within an area of the first region; and
   forming the first portion of the first implanted region by performing a second implant of the dopant species in the semiconductor body at the second region,
   wherein the first region has, orthogonally to the first alignment axis, a respective maximum width having a third value and the second region has, orthogonally to the first alignment axis, a respective maximum width having a fourth value smaller than the third value.

15. The manufacturing process according to claim 14, wherein the first implant and the second implant are performed with a same implant dose.

16. The manufacturing process according to claim 15, wherein the first implant is performed through one or more implants of a dopant species, with implant energy between 200 keV and 500 keV and with the implant dose between $1\cdot 10^{12}$ at/cm$^2$ and $1\cdot 10^{16}$ at/cm$^2$, and
   wherein the second implant is performed through one or more implants of the dopant species, with implant energy between 30 keV and 200 keV and with the implant dose between $1\cdot 10^{12}$ at/cm$^2$ and $1\cdot 10^{16}$ at/cm$^2$.

17. The manufacturing process according to claim 12, wherein the forming the first portion and the second portion of the first implanted region comprises:
   forming, on a first surface of a wafer of silicon carbide having the first type of electrical conductivity, a first hard mask which exposes a first region of the first surface;
   forming the second portion of the first implanted region by performing a first implant of a dopant species in the wafer at the first region;
   forming, on the first surface of the wafer, an epitaxial layer of silicon carbide having the first type of electrical conductivity and defining, with the wafer, the semiconductor body;
   forming, on the epitaxial layer, a second hard mask which exposes a second region of the top surface of the semiconductor body, the second region being within an area of the first region; and
   forming the first portion of the first implanted region by performing a second implant of the dopant species in the epitaxial layer at the second region,
   wherein the first region has, orthogonally to the first alignment axis, a respective maximum width having a third value and the second region has, orthogonally to the first alignment axis, a respective maximum width having a fourth value smaller than the third value.

18. The manufacturing process according to claim 17, wherein the first implant and the second implant are performed with a same implant dose.

19. The manufacturing process according to claim 18, wherein the first implant and the second implant are performed through one or more implants of the dopant species, with implant energy between 30 keV and 200 keV and with the implant dose between $1\cdot 10^{12}$ at/cm$^2$ and $1\cdot 10^{16}$ at/cm$^2$.

20. The manufacturing process according to claim 17, wherein the forming the epitaxial layer includes performing an epitaxial growth with a dopant concentration between $5\cdot 10^{15}$ at/cm$^3$ and $5\cdot 10^{16}$ at/cm$^3$.

* * * * *

UNITED STATES PATENT AND TRADEMARK OFFICE
CERTIFICATE OF CORRECTION

PATENT NO. : 12,224,358 B2  
APPLICATION NO. : 17/584185  
DATED : February 11, 2025  
INVENTOR(S) : Simone Rascuna' et al.

Page 1 of 1

It is certified that error appears in the above-identified patent and that said Letters Patent is hereby corrected as shown below:

In the Claims

Column 16, Claim 1, Line 12:
"impalnted region,"
Should read:
--implanted region,--.

Column 18, Claim 12, Line 52:
"semiconductor body,"
Should read:
--semiconductor body, wherein the first implanted region physically and electrically separates the ohmic contact from the semiconductor body,--.

Signed and Sealed this
Eighth Day of April, 2025

Coke Morgan Stewart
*Acting Director of the United States Patent and Trademark Office*